(12) United States Patent
Zur (10) Patent No.: US 11,276,557 B2
(45) Date of Patent: Mar. 15, 2022

(54) FORMING A VERTICAL SURFACE

(71) Applicant: Applied Materials Israel Ltd., Rehovot (IL)

(72) Inventor: Yehuda Zur, Tel-Aviv (IL)

(73) Assignee: Applied Materials Israel Ltd., Rehovot (IL)

(*) Notice: Subject to any disclaimer, the term of this patent is extended or adjusted under 35 U.S.C. 154(b) by 332 days.

(21) Appl. No.: 16/573,139

(22) Filed: Sep. 17, 2019

(65) Prior Publication Data
US 2021/0082664 A1 Mar. 18, 2021

(51) Int. Cl.
*H01J 37/302* (2006.01)
*H01J 37/305* (2006.01)

(52) U.S. Cl.
CPC ...... *H01J 37/3023* (2013.01); *H01J 37/3053* (2013.01); *H01J 2237/3174* (2013.01)

(58) Field of Classification Search
CPC .... H01J 37/256; H01J 37/304; H01J 37/3056; H01J 2237/2527; H01J 2237/30466; H01L 29/78; H01L 29/7801; H01L 29/786; H01L 21/30; H01L 21/302; H01L 21/306
See application file for complete search history.

(56) References Cited

U.S. PATENT DOCUMENTS

| 5,035,770 A | 7/1991 | Braun |
| 5,541,411 A | 7/1996 | Lindquist et al. |
| 5,616,921 A | 4/1997 | Talbot et al. |
| 5,752,309 A * | 5/1998 | Partee ............... G11B 5/187 216/22 |
| 5,952,658 A | 9/1999 | Shimase et al. |
| 6,359,254 B1 | 3/2002 | Brown |
| 6,414,307 B1 | 7/2002 | Gerlach et al. |
| 6,497,194 B1 | 12/2002 | Libby et al. |
| 6,670,610 B2 | 12/2003 | Shemesh et al. |

(Continued)

FOREIGN PATENT DOCUMENTS

| KR | 10-1999-0036438 A | 5/1999 |
| KR | 10-2012-0109641 A | 10/2012 |
| WO | 2018/052424 A1 | 3/2018 |

OTHER PUBLICATIONS

International Search Report and Written Opinion of the International Searching Authority for Application No. PCT/US2020/032880, dated Sep. 7, 2020, 9 pages.

(Continued)

*Primary Examiner* — David E Smith
*Assistant Examiner* — Hsien C Tsai
(74) *Attorney, Agent, or Firm* — Kilpatrick Townsend & Stockton LLP (57) ABSTRACT

A miller, a non-transitory computer readable medium, and a method. The miller may include an ion beam column that may be configured to form a vertical surface in an object by applying a milling process that may include forming a vertical surface by irradiating, for a certain period of time, an area of an upper surface of an object by a defocused ion beam that comprises multiple rays. During the certain period of time and at a plane of the upper surface of the object, a majority of the multiple rays are closer to an edge of the defocused ion beam than to a center of the defocused ion beam. The focal plane of the defocused ion beam is located below the upper surface of the object.

15 Claims, 6 Drawing Sheets

(56) References Cited

U.S. PATENT DOCUMENTS

| | | |
|---|---|---|
| 10,971,618 B2 * | 4/2021 | Davidescu .......... H01L 29/7835 |
| 2002/0074494 A1 | 6/2002 | Lundquist et al. |
| 2003/0098416 A1 | 5/2003 | Shemesh et al. |
| 2004/0140438 A1 | 7/2004 | Gerlach et al. |
| 2005/0073775 A1 | 4/2005 | Chang et al. |
| 2015/0255248 A1 | 9/2015 | Boguslavsky et al. |
| 2018/0166304 A1 | 6/2018 | Berry, III et al. |

OTHER PUBLICATIONS

International Search Report and Written Opinion of the International Searching Authority for Application No. PCT/US2020/041439, dated Oct. 23, 2020, 8 pages.

U.S. Appl. No. 16/530,331 Notice of Allowance dated Jan. 14, 2021, 8 pages.

U.S. Appl. No. 16/530,331 Corrected Notice of Allowability dated Mar. 11, 2021, 5 pages.

* cited by examiner

FORMING A VERTICAL SURFACE

BACKGROUND

Failure analysis includes exposing the internal structural element of an object that has failed in order to learn the cause of failure.

The internal structural elements may be of sub-micron dimension and the exposure process may require milling the object using a focused ion beam that has a focal plane that coincides with an upper plane of the object.

Milling using a focused ion beam that has a focal plane that coincides with an upper plane of the object generates a milled surface that is not smooth and is not vertical due to a tail effect.

There is a growing need to provide systems, non-transitory computer readable media and methods for forming a vertical surface.

SUMMARY

There may be provided a miller, a non-transitory computer readable medium, and a method. The miller may include an ion beam column that may be configured to form a vertical surface in an object by applying a milling process that may include forming a vertical surface by irradiating, for a certain period of time, an area of an upper surface of an object by a defocused ion beam that includes multiple rays. During the certain period of time and at a plane of the upper surface of the object, a majority of the multiple rays are closer to an edge of the defocused ion beam than to a center of the defocused ion beam. The focal plane of the defocused ion beam is located below the upper surface of the object.

BRIEF DESCRIPTION OF THE DRAWINGS

Examples of embodiments of the disclosure may be particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings in which:

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a miller capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the miller.

Any reference in the specification to a non-transitory computer readable medium should be applied mutatis mutandis to a miller capable of executing the instructions stored in the non-transitory computer readable medium and should be applied mutatis mutandis to method that may be executed by a computer that reads the instructions stored in the non-transitory computer readable medium.

There may be provided a miller, a method, and a non-transitory computer readable medium for forming a vertical surface.

The vertical surface may define a hole, may be a vertical wall, and the like. The forming of the vertical surface may segment the object to multiple segments or may form one or more holes in the object.

The miller may include a controller and an ion beam column.

The controller may be configured to receive or determine milling parameters related to a milling process.

The milling parameters may include at least one out of a duration of milling, ion beam energy, ion beam current, defocus strength, and the like.

The ion beam column may be configured to form the vertical surface in the object by applying the milling process while maintaining the milling parameters.

The applying of the milling process may include forming the vertical surface by irradiating, for a certain period of time, an area of an upper surface of the object by a defocused ion beam that comprises multiple rays.

During the certain period of time and at a plane of the upper surface of the object, a majority (more than half) of the multiple rays are closer to an edge of the defocused ion beam than to a center of the defocused ion beam.

The center of the defocused ion beam is defined along an optical axis of the defocused ion beam.

The concentration of the majority of the rays near the edge of the defocused ion beam provide the vertical milling—especially when using a beam that has a Gaussian Shape at its edge.

For example, assuming that the defocused ion beam has a radius R and exhibits a radial symmetry about an optical axis of the asymmetrical ion beam, then the majority of the beam may be located within a distance that is smaller than 0.1-0.4R from the edge of the defocused ion beam.

A focal plane of the defocused ion beam may be located below the upper surface of the object.

The region of least confusion of the defocused ion beam may coincide with the upper surface of the object.

During the forming of the vertical surface, the upper surface may be closer to the region of least confusion of the defocused ion beam than to the focal plane of the defocused ion beam.

The duration of the irradiating may depend on desired results of the milling (desired vertical surface dimensions, milled materials) and one or more milling parameters such as ion beam energy, ion beam current, defocus strength, and the like. The duration of the irradiating may range between 1 millisecond and more than a second.

Figure 1A:
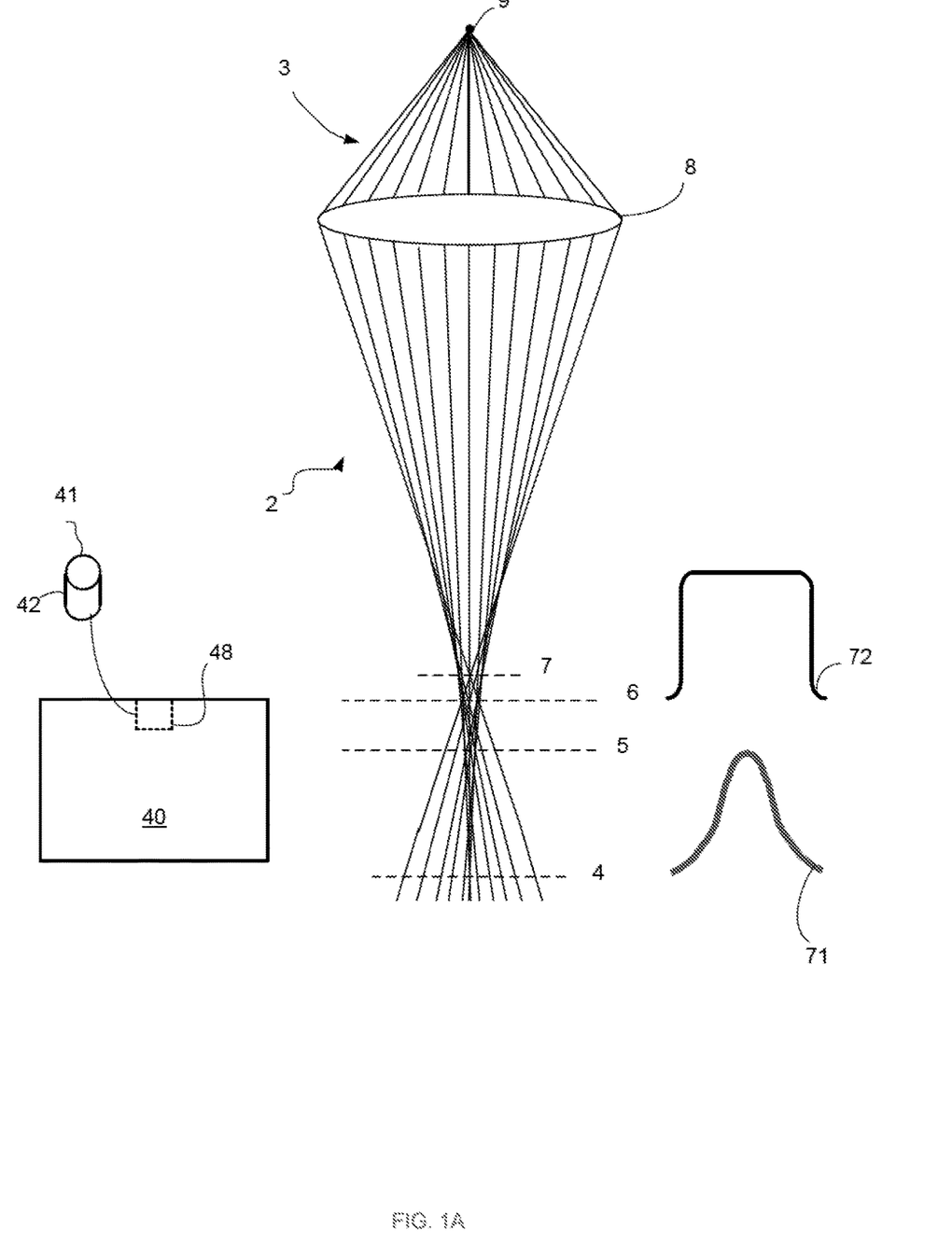
FIG. 1A is an example of an object, an ion beam and various planes related to the ion beam.
Figure 1B:
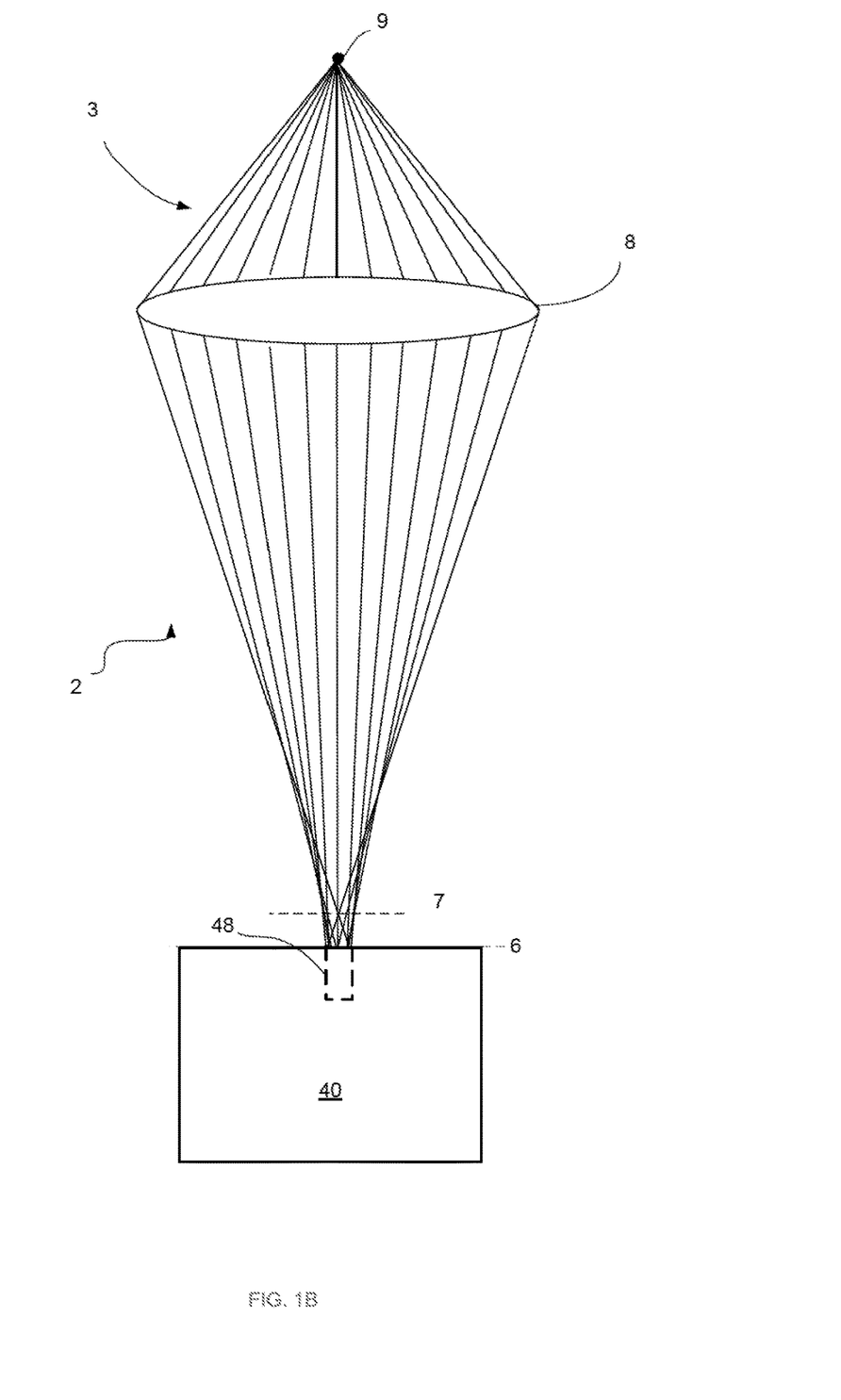
FIG. 1B is an example of an object, an ion beam and various planes related to the ion beam.

FIG. 1A illustrates an ion beam source 9 that outputs an initial ion beam 3 that is focused by objective lens 8 to form a defocused ion beam 2 that has a focal plane 5, a marginal ion ray focus region 7, a paraxial ion ray focus region 4, and a region of least confusion 6. FIG. 1A also illustrates a cross section 72 of the defocused ion beam 2 at the region of least confusion 6, and a cross section 71 of the defocused ion beam 2 at the paraxial ion ray focus region 4. Cross section 72 has substantially a vertical sidewall while cross section 72 has a sloped sidewall. FIG. 1B illustrates the object 40 that is milled by defocused ion beam 2 while the region of least confusion is aligned with the upper surface of object 40.

Some of the multiple rays that form the ion beam defocused ion beam are illustrated as different lines in FIG. 1A. A central ray the coincides with the longitudinal axis of the defocused ion beam is denoted 1.

FIG. 1A illustrates that the region of least confusion 6 of the defocused ion beam may coincide with the upper surface of the object 40 provides a vertical surface 41 with at least one vertical sidewall. The vertical surface 41 of hole 48 is perpendicular to the horizontal upper surface of the object 40. Examples of an object 40 are a semiconductor wafer (e.g. multi-layer 3D NAND), display panel, or solar wafer. The dimensions of the hole 48 may depend on the length of the milling operation and the milled material. For example—a hole of about 10 by 10 by 2.65 micron may be milled during 4.5 minutes using an acceleration of 30 kV and a 1 nano ampere defocused ion beam.

It should be noted that the region of least confusion 6 may not coincide with the upper surface of the object 40. The region of least confusion 6 may be proximate to the upper surface of the object 40. For example, the region of least confusion 6 may be closer to the upper surface of the object 40 than the focal plane of the defocused ion beam.

The vertical surface may be formed when at a plane of the upper surface of the object, a majority of multiple rays of the defocused ion beam are closer to an edge of the defocused ion beam than to a center of the defocused ion beam. An example is shown in FIGS. 1A and 1B.

Figure 2:
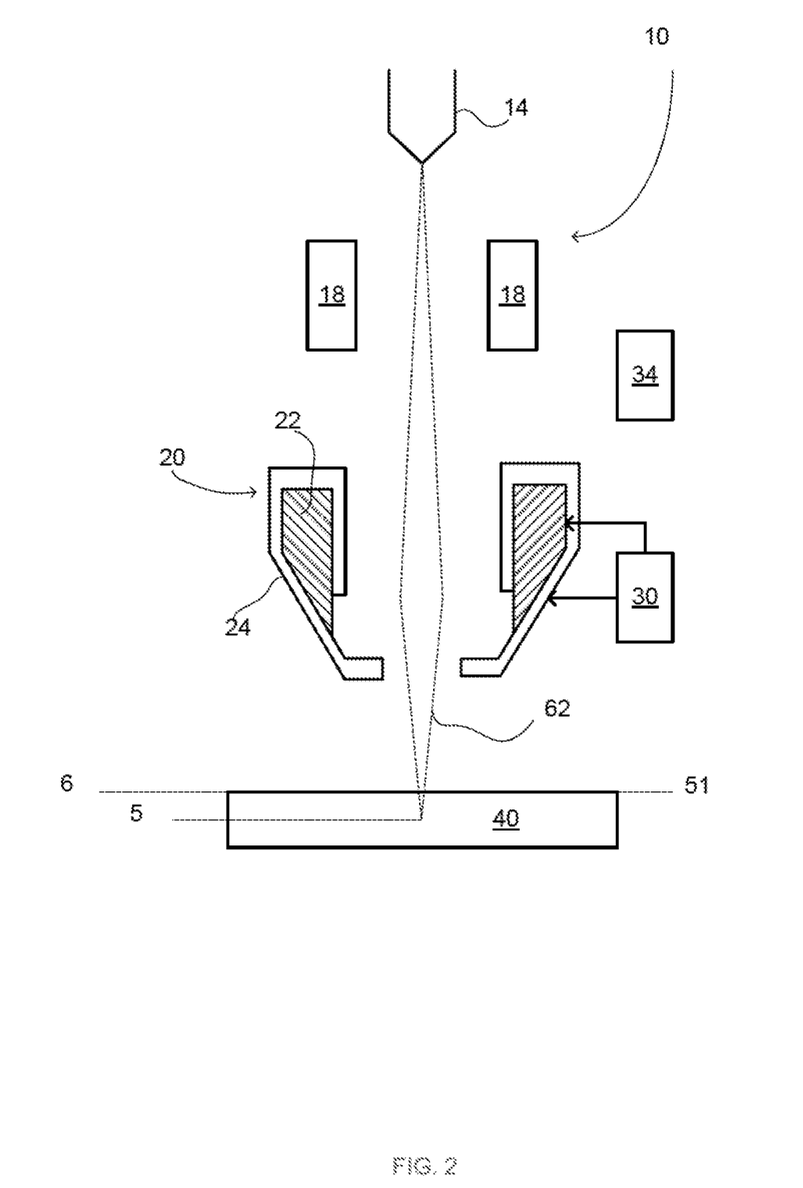
FIG. 2 is an example of a focused ion beam column.

FIG. 2 illustrates an example of an object 40, and a focused ion beam column 10 of a miller.

The focused ion beam column 10 includes a beam source 14, a first lens 18, an objective lens 20, a power supply unit 30 and a controller 34 for controlling the focused ion beam column 10.

The first lens 18 may be a condenser and/or a scanning lens.

Objective lens 20 may include a magnetic lens 22 and an electrostatic lens 24. The bias voltage may be applied to the electrostatic lens 24.

The focused ion beam column 10 may include additional optical elements, other optical elements, and the like.

The focused ion beam column 10 may generate defocused ion beam 62. Initial ion beam (denoted 2 in FIG. 1) and defocused ion beam (denoted 3 in FIG. 1) may form defocused ion beam 62.

The defocused ion beam 62 may be tilted, deflected once or multiple times, may impinge on the object 40 at angles that may be normal to the object 40 or an oblique angles.

FIG. 2 illustrates defocused ion beam 62 that is focused by the objective lens 20 and reaches the upper surface (located in first plane 51) of the object unfocused. The focus plane 5 is below the upper surface.

The defocus strength, as well as other milling parameters may be controlled by controller 34.

Figure 3:
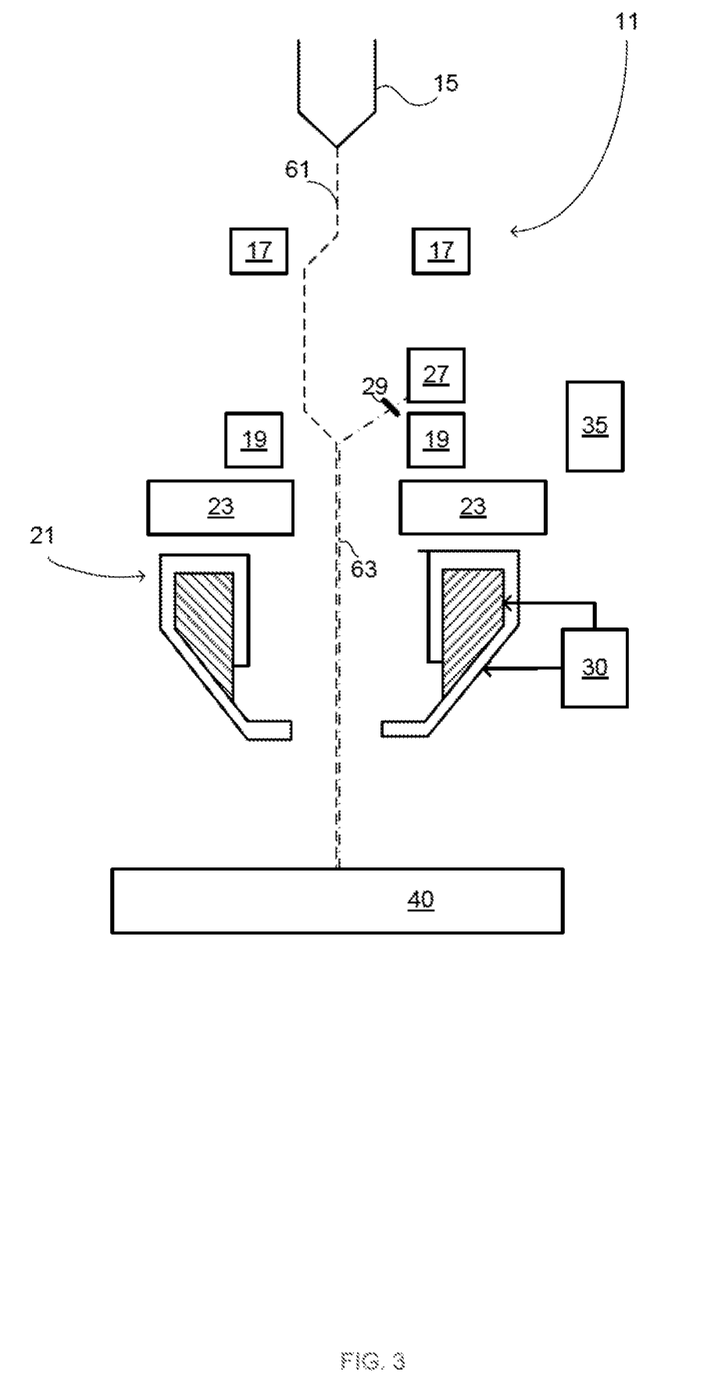
FIG. 3 is an example of a scanning electron microscope column.

FIG. 3 illustrates an example of a scanning electron microscope column (SEM column) 11 of the miller.

The SEM column 11 may include a beam source 15, first double-deflection lenses 17, second double deflection lenses 19, in-lens detector 23, additional detector 27, energy filter 29, objective lens 21, power supply unit 31, and controller 35 for controlling the SEM column 11.

Objective lens 21 may include a magnetic lens and an electrostatic lens. The bias voltage may be applied to the electrostatic lens.

The SEM column 11 may include additional optical elements, other optical elements, and the like. The primary electron beam 61 that impinges on the object 40 may be tilted, deflected once or multiple times, may impinge on the object 40 at angles that may be normal to the object 40 or an oblique angles.

Electrons emitted from the object 40 may reach energy filter 29 or may reach in-lens detector 23. In FIG. 3 the electrons that reach the energy filter 29 are denoted 63.

The energy filter 29 may selectively pass to additional detector 27, electrons of energy that exceeds a threshold that is set by the energy filter 29. Change of the threshold may allow electrons of different energies to reach additional detector 27.

SEM column 11 may include any combinations of detectors.

Figure 4:
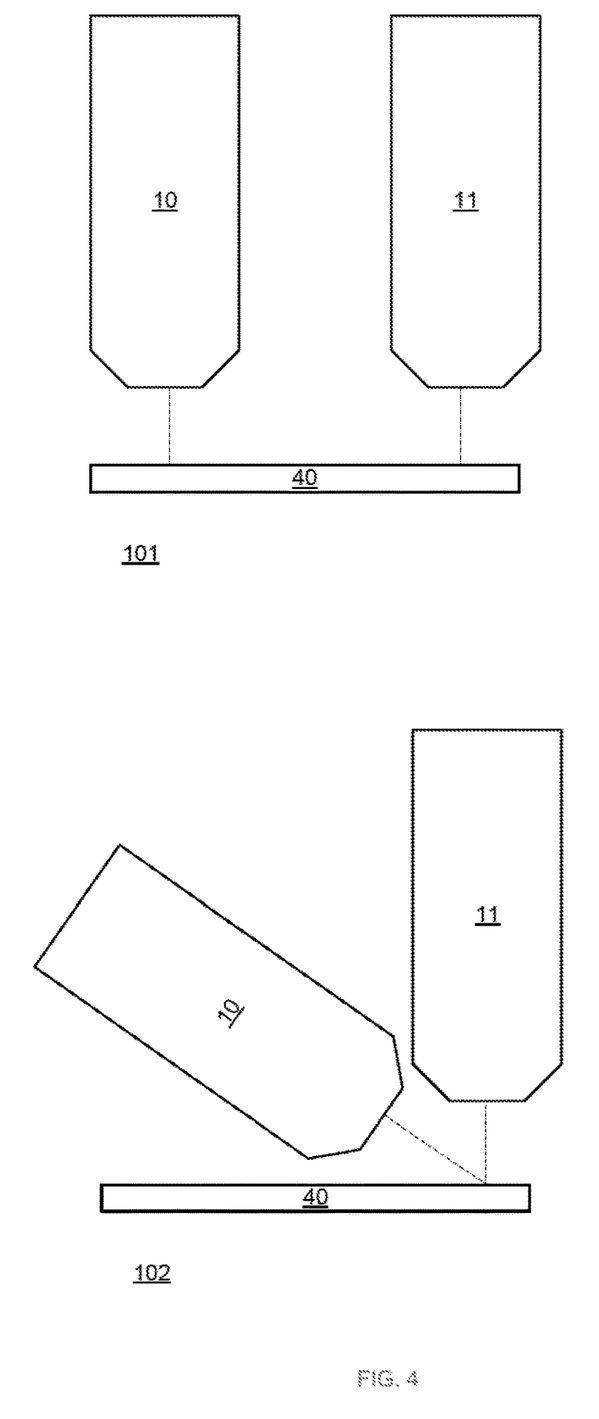
FIG. 4 illustrates examples of a miller.

FIG. 4 illustrates two example of imagers and object 40.

In a first imager 101 the SEM column 11 and the focused ion beam column 10 are parallel to each other. In a second imager 102, the SEM column 11 and the focused ion beam column 10 are oriented to point to the same location.

It should be noted that one of the columns or both columns may be tilted in relation to the other columns and/or in relation to the object 40.

Figure 5:
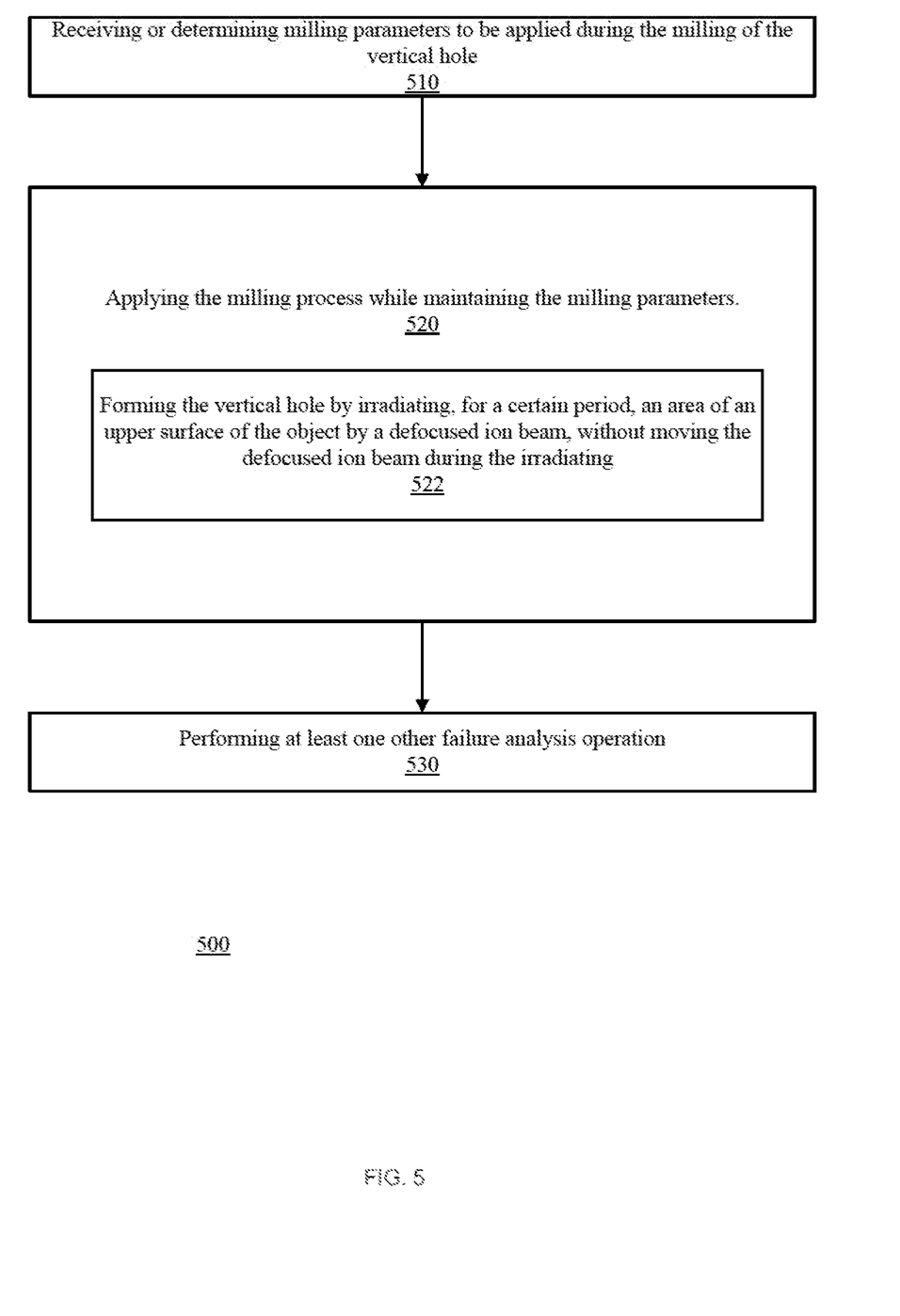
FIG. 5 illustrates an example of a method.

FIG. 5 illustrates an example of method 500.

Method 500 may include steps 510 and 520. Method 500 may also include step 530.

Step 510 may include receiving or determining milling parameters to be applied during the forming of the vertical surface.

Step 520 may include applying the milling process while maintaining the milling parameters.

Step 520 may include step 522 of forming the vertical surface by irradiating, for a certain period of time, an area of an upper surface of the object by a defocused ion beam that includes multiple rays. During the certain period of time, and at a plane of the upper surface of the object, a majority (more than half) of the multiple rays are closer to an edge of the defocused ion beam than to a center of the defocused ion beam.

The center of the defocused ion beam is defined along an optical axis of the defocused ion beam.

A focal plane of the defocused ion beam is located below the upper surface of the object.

Step 522 may include irradiating the area of the upper surface of the object while the upper surface is closer to the region of least confusion of the defocused ion beam than to the focal plane of the defocused ion beam.

For example, step 522 may include irradiating the area of the upper surface of the object while the region of least confusion of the defocused ion beam coincides with the upper surface of the object.

The duration of the irradiating may depend on desired results of the milling (desired vertical surface dimensions, milled materials) and one or more milling parameters such as ion beam energy, ion beam current, defocus strength, and the like. The duration of the irradiating may range between 1 millisecond and more than a second.

Step 520 may be followed by step 530 of performing at least one other failure analysis operation such as collecting critical dimension (CD) measurements of the locations of interest in the one or more vertical sidewalls of the hole using the SEM column 11, processing the CD measurements and generating a three dimensional (3D) analysis of the object.

It should be noted that method 500 may be applied for milling multiple vertical surfaces. Each vertical surface may be formed by executing at least step 520.

Multiple vertical beams may be formed in parallel when using multiple ion beams.

The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may cause the storage system to allocate disk drives to disk drive groups.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on a non-transitory computer readable medium. All or some of the computer program may be provided on computer readable media permanently, removable or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as flash memory, EEPROM, EPROM, ROM; ferromagnetic digital memories; MRAM; volatile storage media including registers, buffers or caches, main memory, RAM, etc.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

I claim:

1. A miller that comprises:
a controller; and
an ion beam column;
wherein the controller is configured to receive or determine milling parameters related to a milling process;
wherein the ion beam column is configured to form a vertical surface in an object by applying the milling process while maintaining the milling parameters;
wherein the applying of the milling process comprises forming the vertical surface by irradiating, for a certain period of time, an area of an upper surface of the object by a defocused ion beam that comprises multiple rays, wherein during the certain period of time and at a plane of the upper surface of the object, a majority of the multiple rays are closer to an edge of the defocused ion beam than to a center of the defocused ion beam; and
wherein a focal plane of the defocused ion beam is located below the upper surface of the object.

2. The miller according to claim 1 wherein a region of least confusion of the defocused ion beam coincides with the plane of the upper surface of the object.

3. The miller according to claim 1 wherein the upper surface of the object is closer to a region of least confusion of the defocused ion beam than to the focal plane of the defocused ion beam.

4. The miller according to claim 1 wherein the irradiating of the area is executed without moving the defocused ion beam.

5. The miller according to claim 1 wherein the irradiating of the area is executed while moving the defocused ion beam.

6. A method for forming a vertical surface in an object, wherein the method comprises:
forming the vertical surface by irradiating, for a certain period, an area of an upper surface of the object by a defocused ion beam that comprises multiple rays, wherein during the certain period and at a plane of the upper surface of the object, a majority of the multiple rays are closer to an edge of the defocused ion beam than to a center of the defocused ion beam; and
wherein a focal plane of the defocused ion beam is located below the upper surface of the object.

7. The method according to claim 6 wherein a region of least confusion of the defocused ion beam is positioned within a plane of the upper surface of the object.

8. The method according to claim 6 wherein the upper surface of the object is closer to a region of least confusion of the defocused ion beam than to the focal plane of the defocused ion beam.

9. The method according to claim 6 comprising receiving or determining milling parameters to be applied during the forming of the vertical surface and maintaining the milling parameters during the forming of the vertical surface.

10. The method according to claim 6 wherein the irradiating of the area is executed without moving the defocused ion beam.

11. The method according to claim 6 wherein the irradiating of the area is executed while moving the defocused ion beam.

12. A non-transitory computer readable medium that stores instructions executable by a processor to cause a miller to:

form a vertical surface by irradiating, for a certain period of time, an area of an upper surface of an object by a defocused ion beam that comprises multiple rays, wherein during the certain period of time and at a plane of the upper surface of the object, a majority of the multiple rays are closer to an edge of the defocused ion beam than to a center of the defocused ion beam; and wherein a focal plane of the defocused ion beam is located below the upper surface of the object.

13. The non-transitory computer readable medium according to claim 12 wherein a region of least confusion of the defocused ion beam is positioned within the plane of the upper surface of the object.

14. The non-transitory computer readable medium according to claim 12 wherein the upper surface of the object is closer to a region of least confusion of the defocused ion beam than to a focal plane of the defocused ion beam.

15. The non-transitory computer readable medium according to claim 12 comprising receiving or determining milling parameters to be applied during the forming of the vertical surface; and maintaining the milling parameters during the forming of the vertical surface.

\* \* \* \* \*